(12) United States Patent
Sun (10) Patent No.: US 7,545,184 B2
(45) Date of Patent: Jun. 9, 2009

(54) ANALOG BUFFER IN A SOURCE DRIVER

(75) Inventor: Wein-Town Sun, Hsin-chu (TW)

(73) Assignee: Au Optronics Corp., Hsin-Chu (TW)

( * ) Notice: Subject to any disclaimer, the term of this patent is extended or adjusted under 35 U.S.C. 154(b) by 13 days.

(21) Appl. No.: 11/730,841

(22) Filed: Apr. 4, 2007

(65) Prior Publication Data
US 2008/0054954 A1 Mar. 6, 2008

(30) Foreign Application Priority Data
Sep. 5, 2006 (TW) .............................. 95132742 A (51) Int. Cl.
*H03B 1/00* (2006.01)
*H03K 3/00* (2006.01)

(52) U.S. Cl. .................... 327/112; 327/108; 327/109; 327/391; 327/554; 326/33; 326/83; 326/85; 326/87; 326/88; 345/98

(58) Field of Classification Search ................. 327/108, 327/109, 391, 554, 112; 326/83, 85, 87, 326/88, 33; 345/98–100
See application file for complete search history.

(56) References Cited

U.S. PATENT DOCUMENTS

| | | | |
|---|---|---|---|
| 6,181,314 B1 * | 1/2001 | Nakajima et al. ........... 345/100 |
| 6,313,819 B1 | 11/2001 | Maekawa et al. |
| 6,876,235 B2 * | 4/2005 | Li et al. ..................... 327/112 |
| 2004/0095159 A1 * | 5/2004 | Kimura ....................... 326/33 |
| 2004/0183772 A1 | 9/2004 | Nakajima et al. |
| 2006/0152461 A1 * | 7/2006 | Kida et al. .................... 345/98 |
| 2006/0170461 A1 * | 8/2006 | Bhattacharya et al. ........ 327/65 |

FOREIGN PATENT DOCUMENTS

| | | |
|---|---|---|
| CN | 1549232 A | 11/2004 |
| JP | 2006-173780 A | 6/2006 |

* cited by examiner

*Primary Examiner*—Kenneth B Wells
*Assistant Examiner*—John W Poos
(74) *Attorney, Agent, or Firm*—Rabin & Berdo, PC.

(57) ABSTRACT

An analog buffer used in a source driver is provided. The analog buffer havs an input end, an output end, a transistor, first and second capacitors, first, second, third, fourth and fifth switches. The source and the drain of the transistor is coupled to the output end and receives a first voltage respectively. The first end of the first and the second capacitors are coupled to the gate of the transistor. The second end of the first and the second capacitors are coupled to the first end of the first, second and fourth switches and the first end of the third and fifth switches respectively. The second end of the first switch receives a second voltage. The second end of the second and third switches are coupled to the input end. The second end of the fourth and fifth switches are coupled to the output end.

18 Claims, 11 Drawing Sheets

ANALOG BUFFER IN A SOURCE DRIVER

This application claims the benefit of Taiwan Patent Application Serial No. 095132742, filed Sep. 5, 2006, the subject matter of which is incorporated herein by reference.

BACKGROUND OF THE INVENTION

1. Field of the Invention

The invention relates in general to an analog buffer, and more particularly, to an analog buffer capable of accurately following an input voltage.

2. Description of the Related Art

In the design of analog buffer, the technology of using the source follower as the analog buffer of a source driver is provided to resolve the non-uniformity of display panel caused by the variance in element characteristics of the thin film transistors (TFTs), and further downsize the data driver.

Figure 1A:
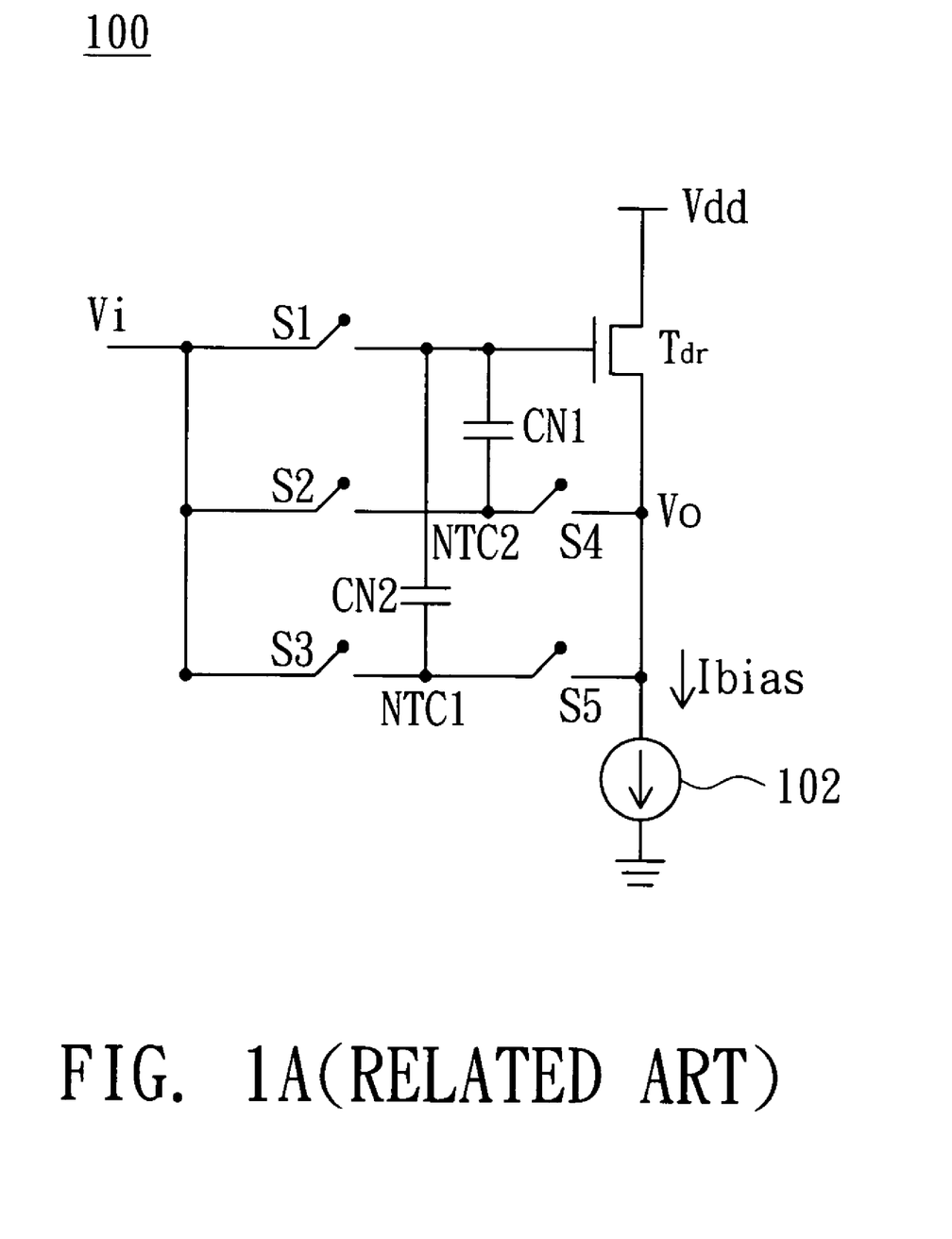
FIG. 1A is a conventional circuit diagram of a conventional analog buffer.
Figure 1B:
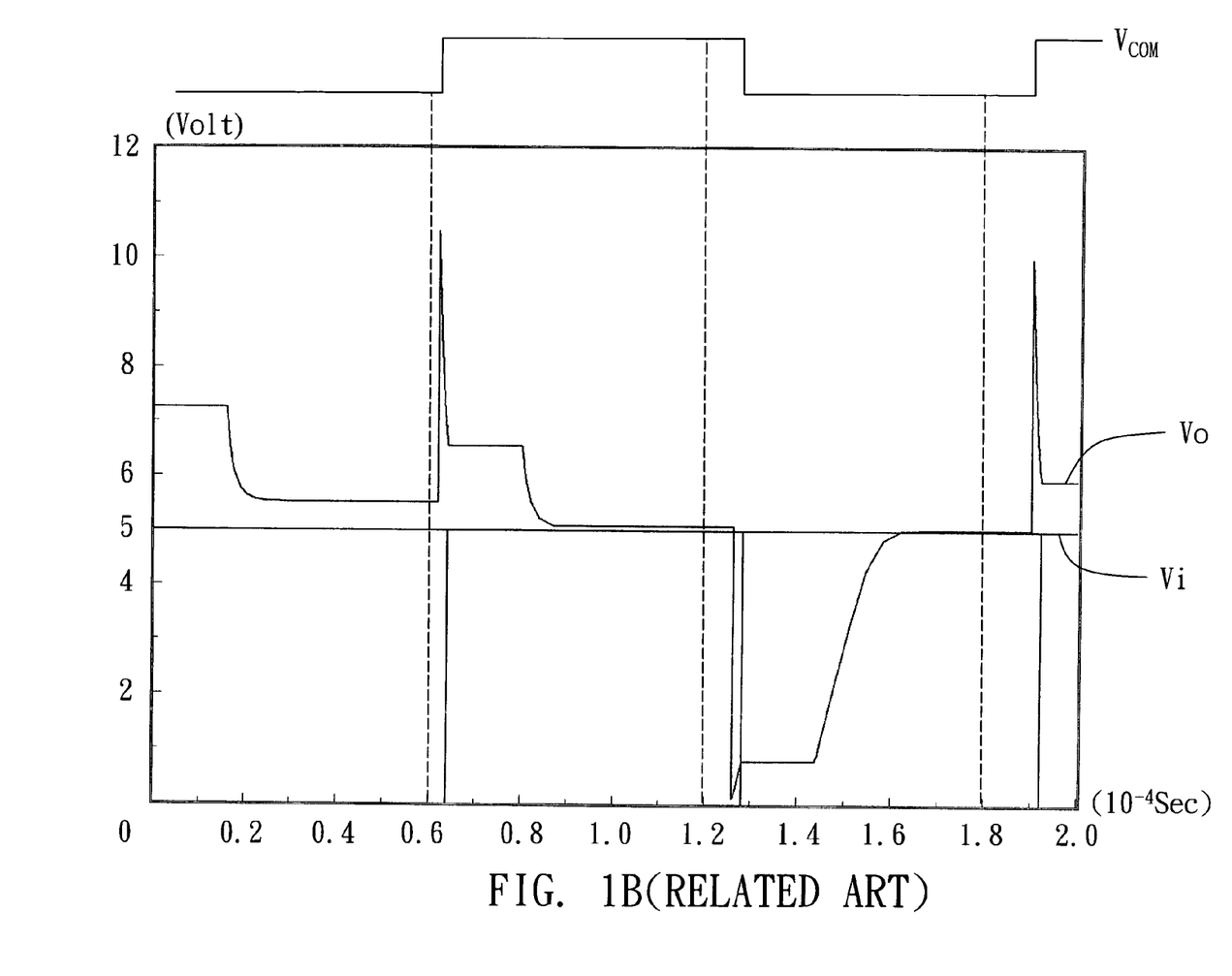
FIG. 1B is a timing diagram of relevant signal simulation of the analog buffer of FIG. 1A.

Referring to FIGS. 1A and 1B, FIG. 1A is a circuit diagram of a conventional analog buffer. FIG. 1B is a timing diagram of relevant signal simulation of the analog buffer 100 of FIG. 1A. In the analog buffer 100, the switches S1~S3 are mutually coupled by one end to receive an input signal Vi. Referring to FIG. 1B, there are discrepancies between the voltage level of the output signal Vo and the voltage level of the input signal Vi. That is, the output voltage Vo of the analog buffer 100 can not accurately follow the input voltage Vi. Thus, how to develop an analog buffer 100 with buffer effect for enabling the output voltage Vo to accurately follow the input voltage Vi has become an imminent goal to achieve.

SUMMARY OF THE INVENTION

It is therefore an object of the invention to provide an analog buffer capable of outputting a data signal with accurate output voltage level to improve the display quality of a liquid crystal display panel.

The above-identified object of the present invention is achieved by providing an analog buffer used in a source driver. The analog buffer has an input end and an output end. The input end is used to receive an input voltage. The analog buffer comprises a transistor, a current source, first capacitor, second capacitor, and first to fifth switches. The source of the transistor is electrically coupled to the output end, and the drain of the transistor receives first voltage. The current source is used to output a bias current flowing through the transistor to bias the transistor. The first end of the first capacitor and the second capacitor are electrically coupled to the gate of the transistor. The first end of the first switch receives a second voltage and the second end of the first switch is electrically coupled to the gate of the transistor. The first and the second ends of the second switch are electrically coupled to the input end and the second end of the first capacitor respectively. The first and the second ends of the third switch are electrically coupled to the input end and the second end of the second capacitor respectively. The first and the second ends of the fourth switch are electrically coupled to the second end of the first capacitor and the output end respectively. The first and the second ends of the fifth switch are electrically coupled to the second end of the second capacitor and the output end respectively.

Another object of the present invention is achieved by providing an analog buffer used in a source driver. The analog buffer has an input end and an output end. The input end is used to receive an input voltage. The analog buffer includes a transistor, first capacitor, second capacitor, and first to fifth switches. The source of the transistor is electrically coupled to the output end, and the drain of the transistor receives first voltage. The current source is used to output a bias current flowing through the transistor to bias the transistor. The first end of the first capacitor and the second capacitor are electrically coupled to the gate of the transistor and the second end of the first capacitor respectively. The first and the second ends of the first switch receives a second voltage and electrically coupled to the gate of the transistor respectively. The first and the second ends of the second switch are electrically coupled to the input end and the second end of the first capacitor respectively. The first and the second ends of the third switch are electrically coupled to the input end and the second end of the second capacitor respectively. The first and the second ends of the fourth switch are electrically coupled to the second end of the first capacitor and the output end respectively. The first and the second ends of the fifth switch are electrically coupled to the second end of the second capacitor and the output end respectively.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 2A:
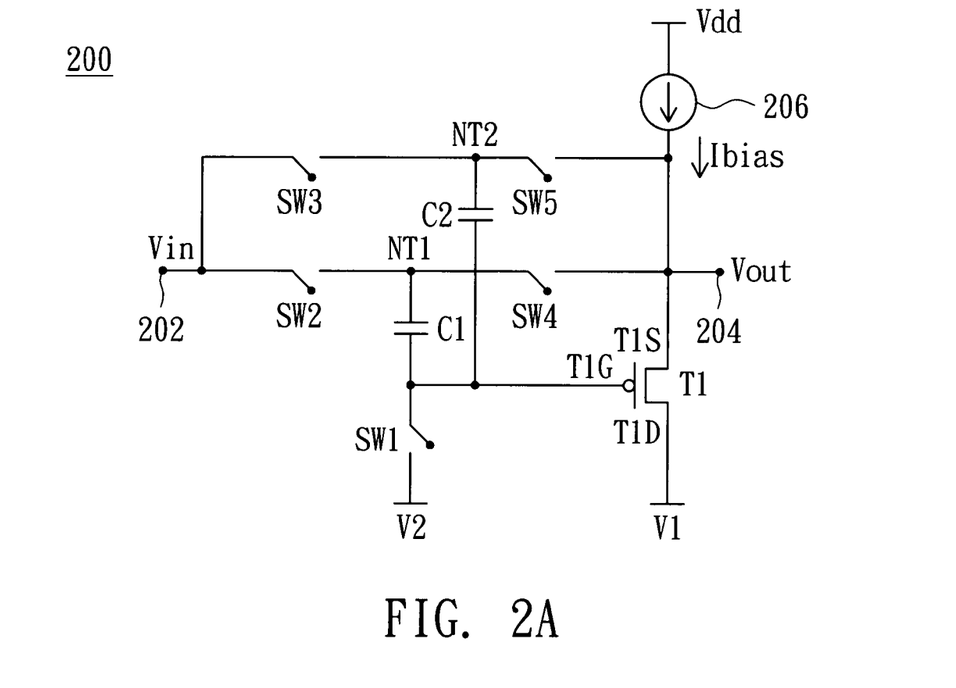
FIG. 2A is a circuit diagram of the analog buffer of the first embodiment of the present invention.

Referring to FIG. 2A, a circuit diagram of the analog buffer of the first embodiment is shown. The analog buffer 200 is used in, the source driver of a liquid crystal display. The analog buffer 200 has an input end 202 and an output end 204 respectively used to receive an input voltage Vin and output an output voltage Vout. The analog buffer 200 comprises a current source 206, a transistor T1, two capacitors C1 and C2, and five switches SW1, SW2, SW3, SW4 and SW5. In the present embodiment of the invention, the transistor T1 is exemplified by a P-type thin film transistor (TFT).

The source T1S of the transistor T1 is electrically coupled to the output end 204, and the drain T1D of the transistor T1 receives a voltage V1. The current source 206 is used to output a bias current Ibias flowing through the transistor T1 and provide a current to bias the transistor T1. When the current flowing through the transistor T1 is the bias current Ibias, let the cross-voltage between the gate T1G of the transistor T1 and the source T1S of the transistor T1 be voltage Vx. The voltage Vx is related to a threshold voltage Vth of the transistor T1, and preferably equal to threshold voltage Vth. The voltage Vth is a real number smaller than zero. The transistor T1 is preferably operated in a saturation region.

The current source 206 is electrically coupled to the source T1D, and the other end of the current source 206 receives voltage Vdd. The two ends of the capacitor C1 are respectively electrically coupled to a gate T1G and a node NT1. The two ends of capacitor C2 are respectively electrically coupled to the gate T1G and a node NT2. The two ends of the switch SW1 are respectively receives voltage V2 and electrically coupled to the gate T1G. The two ends of the switch SW2 of the gate of the transistor are respectively electrically coupled to the input end 202 and the node NT1. The two ends of the switch SW3 are respectively electrically coupled to the input end 202 and the node NT2. The two ends of the switch SW4 are respectively electrically coupled to the node NT1 and the output end 204. The two ends of the switch SW5 are respectively electrically coupled to the node NT2 and the output end 204.

Figure 2B:
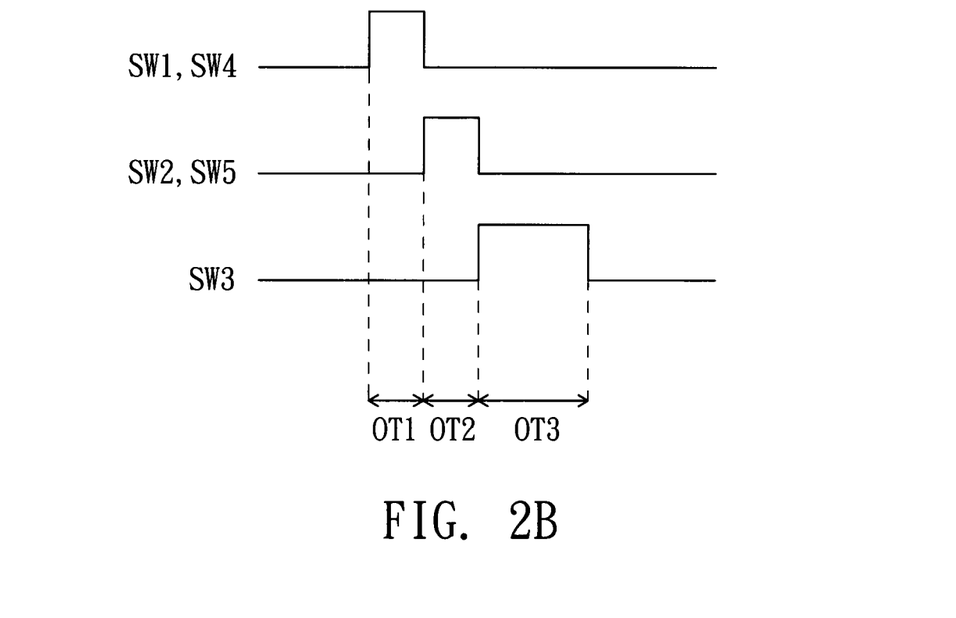
FIG. 2B is an operating timing diagram of the switches SW1~SW5 of FIG. 2A.

Referring to FIG. 2B, an operating timing diagram of the switches SW1~SW5 of FIG. 2A is shown. The analog buffer 200 comprises a first operating period OT1, a second operating period OT2 and a third operating period OT3. The second operating period OT2 comes after the first operating period OT1, and the third operating period OT3 comes after the second operating period OT2.

Figure 2C:
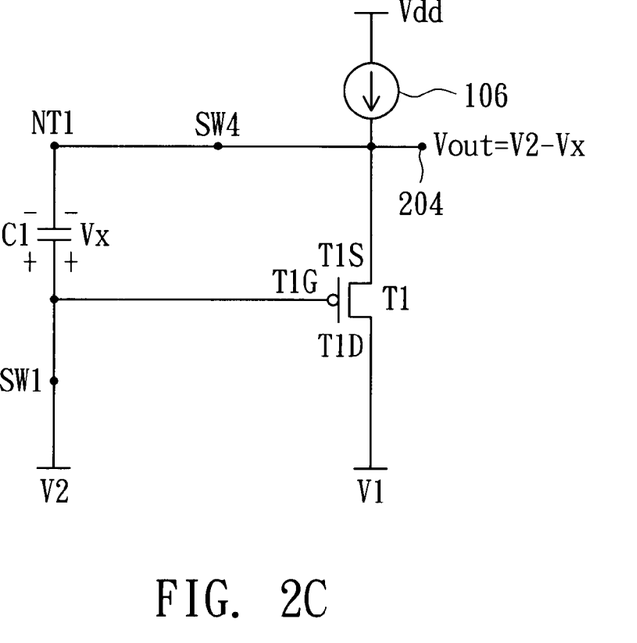
FIG. 2C is an equivalent circuit diagram of the analog buffer when the analog buffer of FIG. 2A is operated in a first operating period OT1.

Referring to FIG. 2C, an equivalent circuit diagram of the analog buffer 200 when the analog buffer 200 of FIG. 2A is operated in a first operating period OT1 is shown. When the analog buffer 200 is operated in the first operating period OT1, the switches SW1 and SW4 are enabled, but the switches SW2, SW3 and SW5 are disabled. Meanwhile, as the capacitor C1 crosses over the gate T1G and the source T1S, the cross-voltage between the two ends of the capacitor C1 is substantially equal to a voltage Vx. Meanwhile, the voltage of the gate T1G is substantially equal to a voltage V2, and the output voltage Vout is substantially equal to the voltage of the node NT1. Meanwhile, the output voltage Vout is substantially equal to the difference between the voltage V2 and the voltage Vx.

Figure 2D:
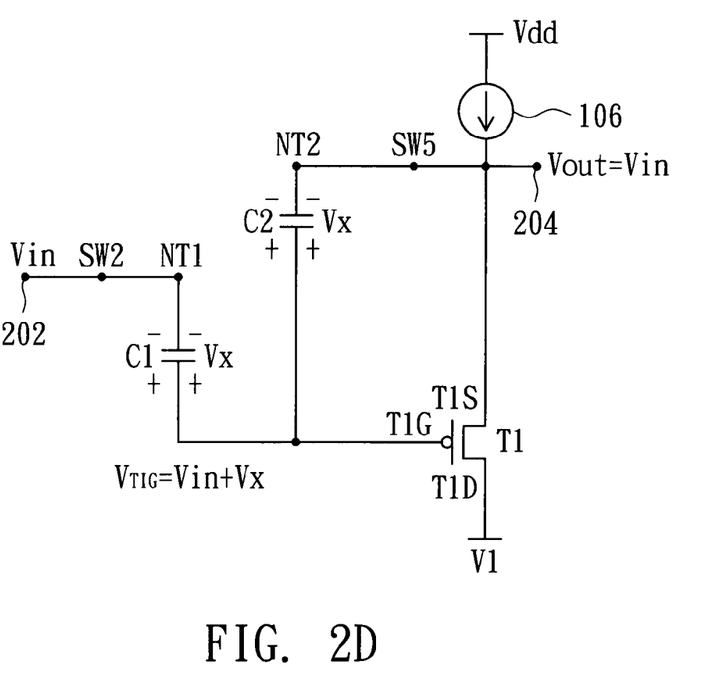
FIG. 2D is an equivalent circuit diagram of the analog buffer when the analog buffer of FIG. 2A is operated in a second operating period OT2.

Referring to FIG. 2D, an equivalent circuit diagram of the analog buffer 200 when the analog buffer 200 of FIG. 2A is operated in a second operating period OT2 is shown. When the analog buffer 200 is operated in the second operating period OT2, the switches SW2 and SW5 are enabled, but the switches SW1, SW3 and SW4 are disabled. Meanwhile, the node NT1 is short-circuited to the input end 202, such that the voltage of the node NT1 is substantially equal to the input voltage Vin. Meanwhile, the voltage of the gate T1G is substantially equal to the sum of the input voltage Vin and the voltage Vx.

Thus, there is a voltage change ΔV in the voltage of the gate T1G between the first operating period OT1 and the second operating period OT2. The voltage change expressed as:

$$\Delta V = (Vin + Vx) - (V2) = Vin + Vx - V2.$$

Meanwhile, since the source current of the transistor T1 is substantially equal to the bias current Ibias, the cross-voltage between the gate T1G of the transistor T1 and the source T1S of the transistor T1 is fixed at voltage Vx as the source current is fixed. Thus, there is the same voltage change ΔV in the source T1S between the first operating period OT1 and the second operating period OT2. Therefore, the voltage of the source T1S, that is, the output voltage Vout, is expressed as:

$$Vout = (V2 - Vx) + \Delta V = (V2 - Vx) - (Vin + Vx - V2) = Vin.$$

Thus, the output voltage Vout is substantially equal to input voltage Vin.

Figure 2E:
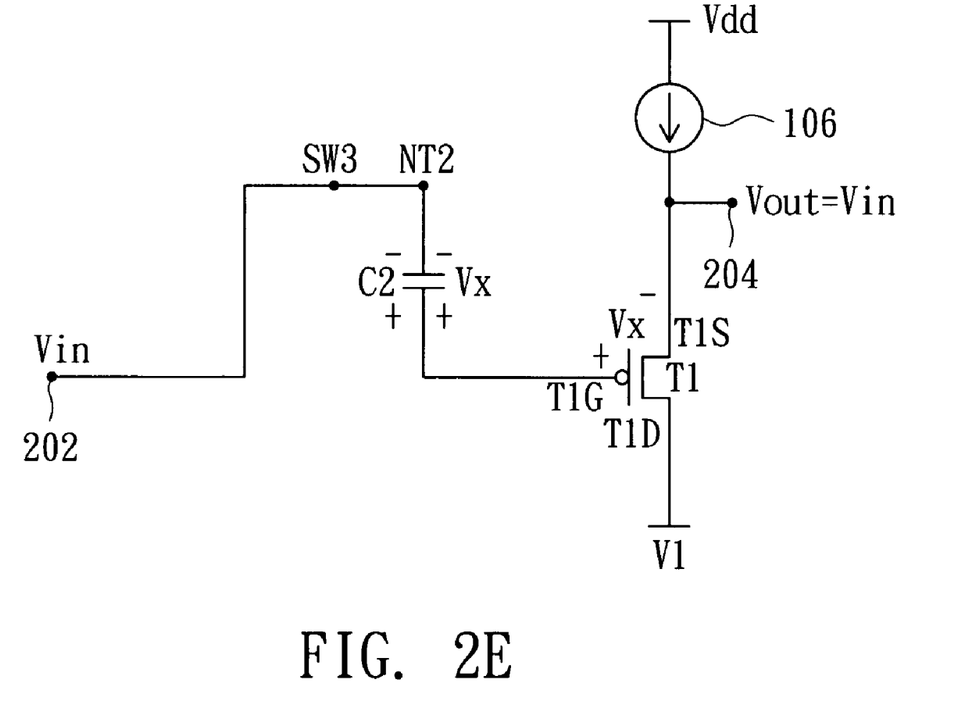
FIG. 2E is an equivalent circuit diagram of the analog buffer when the analog buffer of FIG. 2A is operated in a third operating period OT3.

Referring to FIG. 2E, an equivalent circuit diagram of the analog buffer 200 when the analog buffer 200 of FIG. 2A is operated in a third operating period OT3 is shown. When the analog buffer 200 is operated in the third operating period OT3, the switch SW3 are enabled, but the switches SW1, SW2, SW4 and SW5 are disabled. Meanwhile, the node NT2 is electrically coupled to the input end 102, such that the voltage of the node NT2 is substantially equal to the input voltage Vin. Meanwhile, the voltage of the gate T1G is substantially equal to the sum of the input voltage Vin and the threshold voltage Vx. Meanwhile, the output voltage Vout remains to be substantially equal to Vin as the cross-voltage between the gate T1G and the source T1S is fixed at voltage Vx.

Figure 2F:
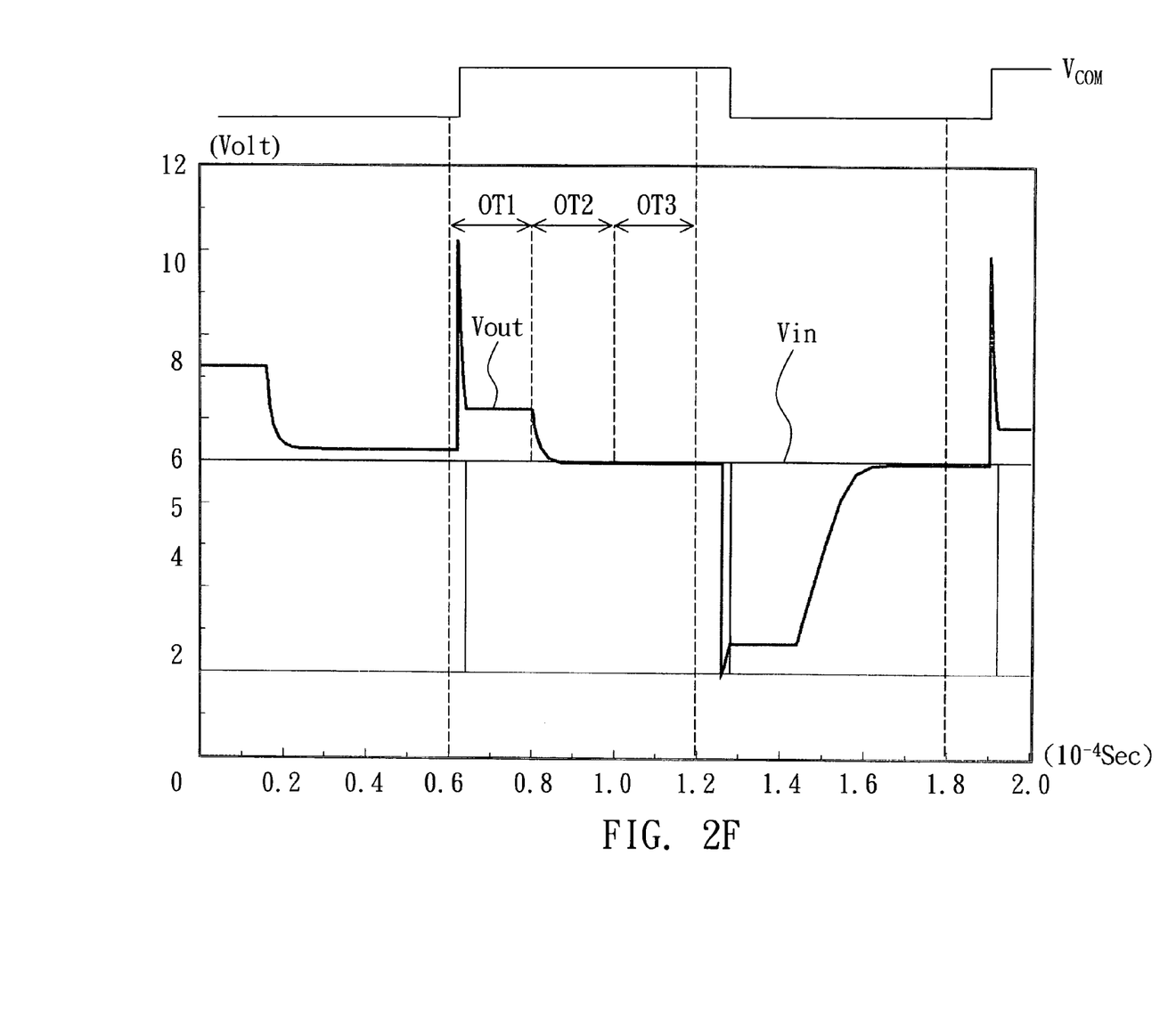
FIG. 2F is a signal simulation diagram of the output signal Vout and the input signal Vin of FIG. 2A.

Referring to FIG. 2F, a signal simulation diagram of the output signal Vout and the input signal Vin of FIG. 2A is shown. In FIG. 2F, the input signal Vin is a direct current voltage signal whose voltage level is 5V. The common voltage Vcom of the liquid crystal display is an alternate current signal. At 0.8×10-4~1.2×10-4 second, the voltage level of the output signal Vout is substantially equal to the voltage level of the input signal, that is, 5V. Compared with the output signal Vo of FIG. 1B, the output signal Vout of FIG. 2F follows the input signal Vin more accurately. Thus, the analog buffer 200 disclosed in the present embodiment of the invention has better performance in following voltage level.

In the present embodiment of the invention, the voltage V2 and V1 preferably satisfy: V2−V1>=Vth. Thus, the voltage V2 and V1 bias the transistor T1 in a saturation region.

According to the analog buffer of the present embodiment of the invention, the cross-voltage between the capacitor C1 and the capacitor C2 is equal to voltage Vx through the switch of enabling time among the switches SW1~SW5. The analog buffer of the present embodiment of the invention further fixes the source current of the TFT T1 at bias current Ibias by the current source 206, such that the voltage of the output voltage Vout follows the input voltage Vin in the second operating period OT2 and the third operating OT3. The analog buffer 200 of the present embodiment of the invention effectively enables the voltage level of the output voltage Vout to follow the voltage level of the input voltage Vin more accurately. Compared with the conventional analog buffer, the analog buffer 200 of the present embodiment of the invention has better voltage buffer effect and outputs output voltage more accurately, such that the display quality of a liquid crystal display panel is improved.

Second Embodiment

Figure 3:
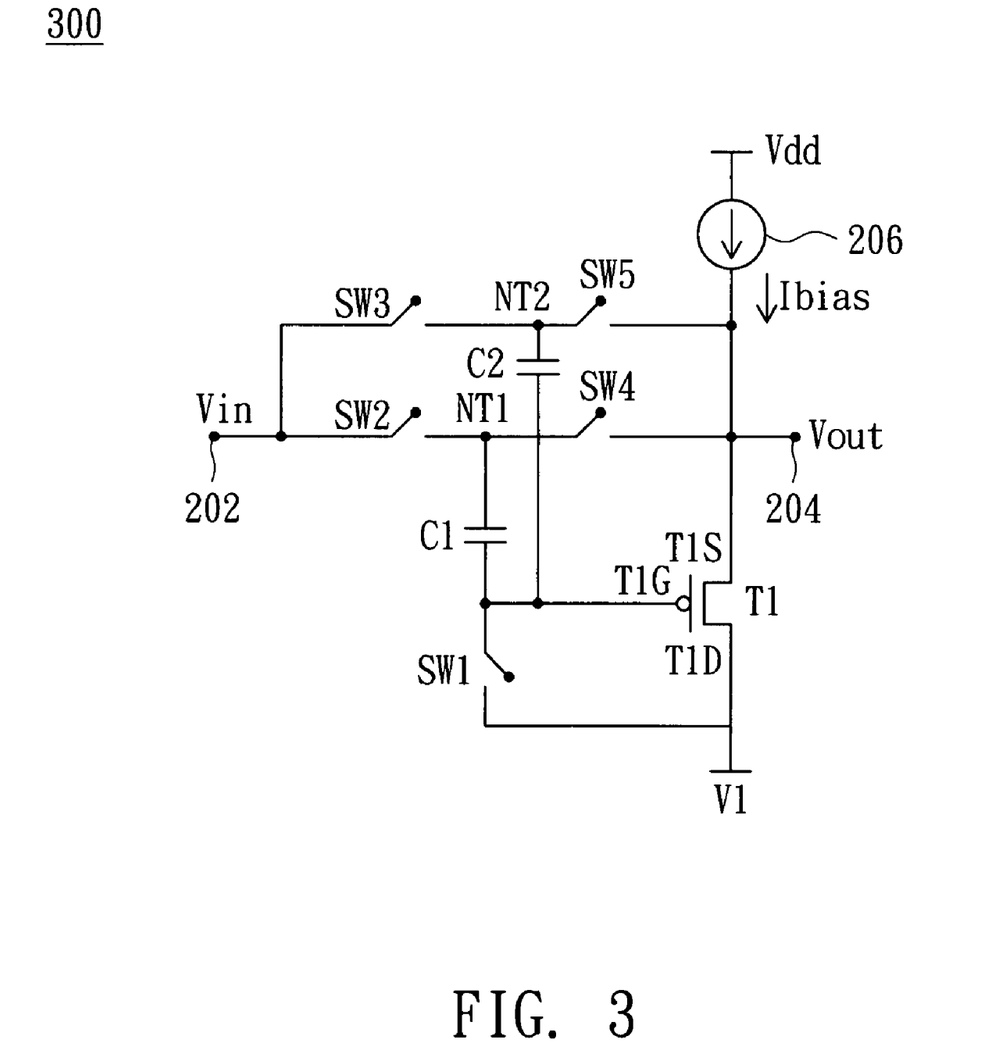
FIG. 3 is a circuit diagram of the analog buffer of the second embodiment of the present invention.

Referring to FIG. 3, a circuit diagram of the analog buffer of the second embodiment is shown. The analog buffer 300 of the second embodiment differs with the analog buffer 200 of the first embodiment in that one end of the switch SW1 also receives the voltage V1, such that the transistor T1 is biased in a saturation region. The analog buffer 200 of the present embodiment of the invention also enables the voltage level of the output voltage Vout to follow the voltage level of the input voltage Vin accurately.

Third Embodiment

Figure 4:
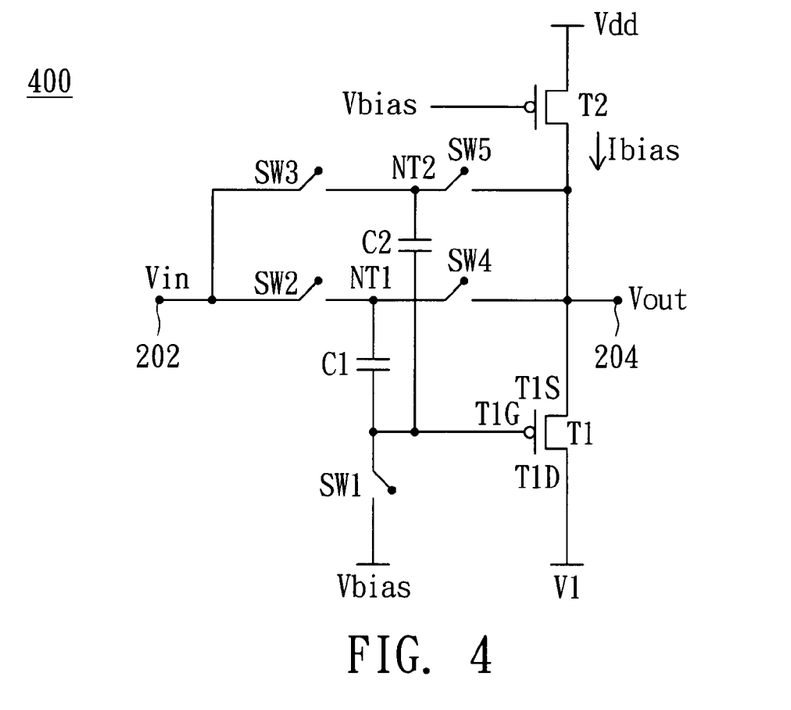
FIG. 4 is a circuit diagram of the analog buffer of the third embodiment of the present invention.

Referring to FIG. 4, a circuit diagram of the analog buffer of the third embodiment is shown. The analog buffer 400 of the third embodiment differs with the analog buffer 200 of the first embodiment in that the current source 206 is embodied by the transistor T2 whose gate is biased to the voltage Vbias. The voltage V2 is substantially equal to the voltage Vbias. The voltage Vbias satisfies: Vbias−Vdd<=Vth, such that the transistor T2 will not enter termination region. The voltage Vbias further satisfies: Vbias−V1>=Vth, such that the transistor T1 is biased in a saturation region. The analog buffer 200 of the present embodiment of the invention also enables the voltage level of the output voltage Vout to follow the voltage level of the input voltage Vin accurately.

Fourth Embodiment

Figure 5A:
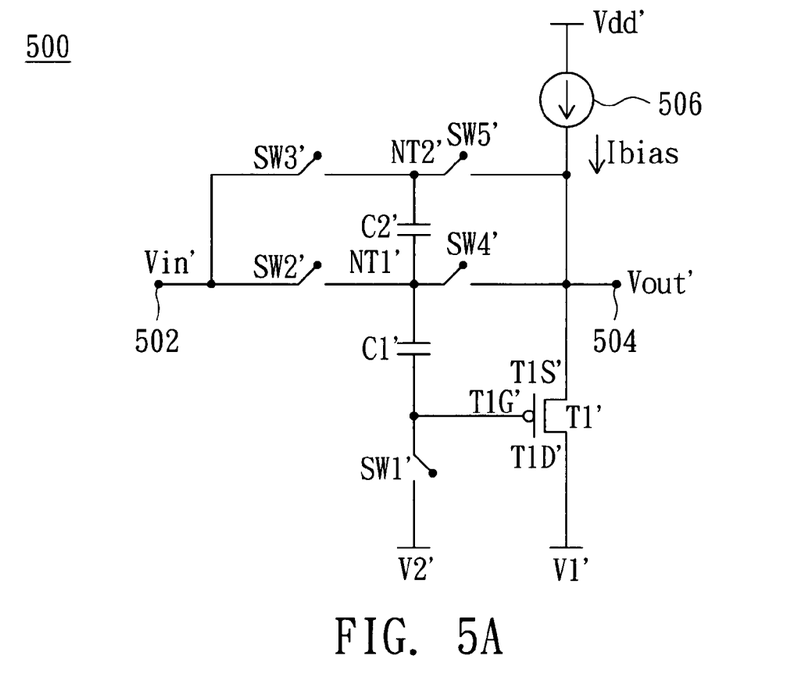
FIG. 5A is a circuit diagram of the analog buffer of the fourth embodiment of the present invention.

Referring to FIG. 5A, a circuit diagram of the analog buffer of the fourth embodiment is shown. The analog buffer 500 of the fourth embodiment differs with the analog buffer 200 of the first embodiment in that the two ends of the capacitor C2' are electrically coupled to a node NT1' and a node NT2' respectively.

Figure 5B:
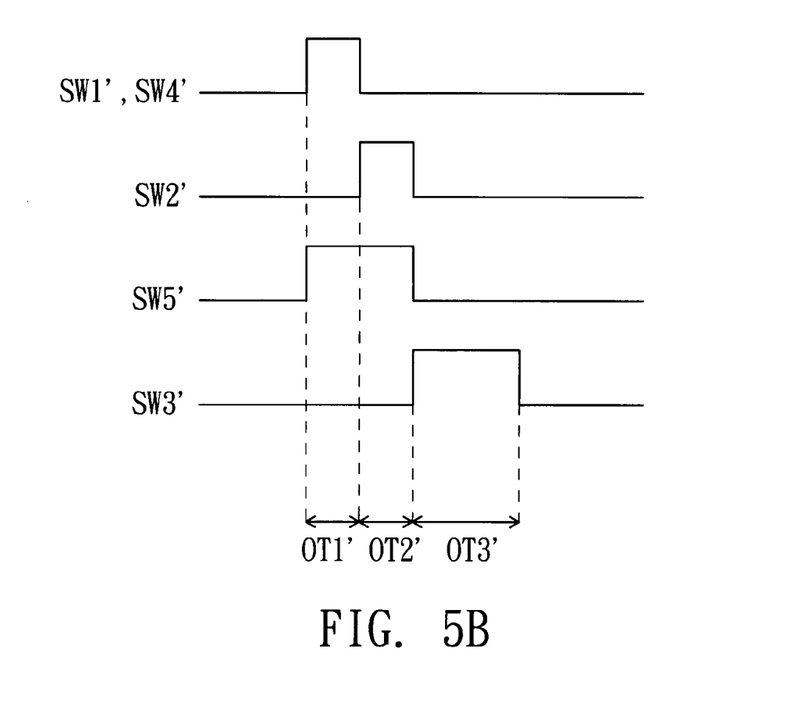
FIG. 5B is an operating timing diagram of the switches SW1'~SW5' of FIG. 5A.

Referring to FIG. 5B, an operating timing diagram of the switches SW1'~SW5' of FIG. 5A is shown. The operation of the switches SW1'~SW5' of the fourth embodiment differs with the switches SW1~SW5 of the first embodiment in that the switches SW5' are all turned on in operating periods OT1' and OT2'.

Figure 5C:
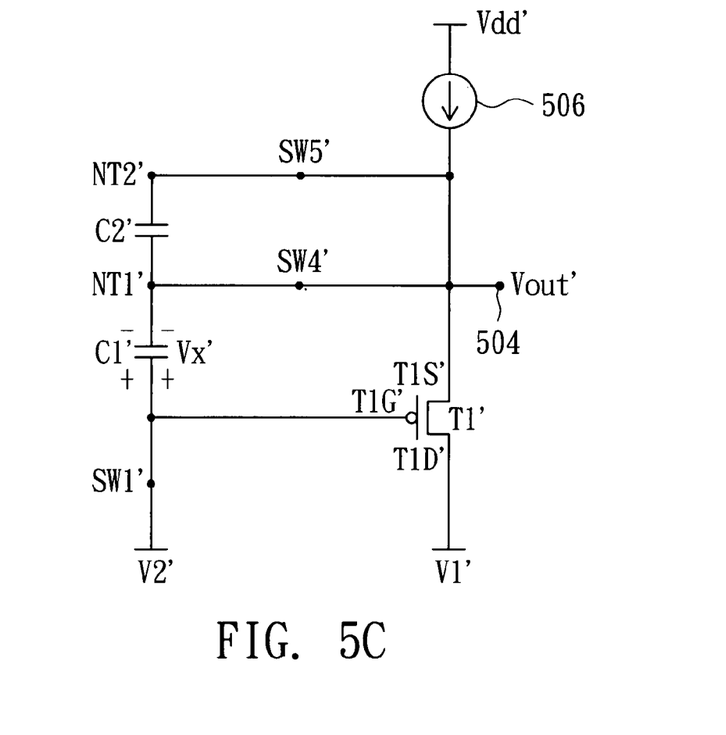
FIG. 5C is an equivalent circuit diagram of the analog buffer when the analog buffer of FIG. 5A is operated in a first operating period OT1'.
Figure 5D:
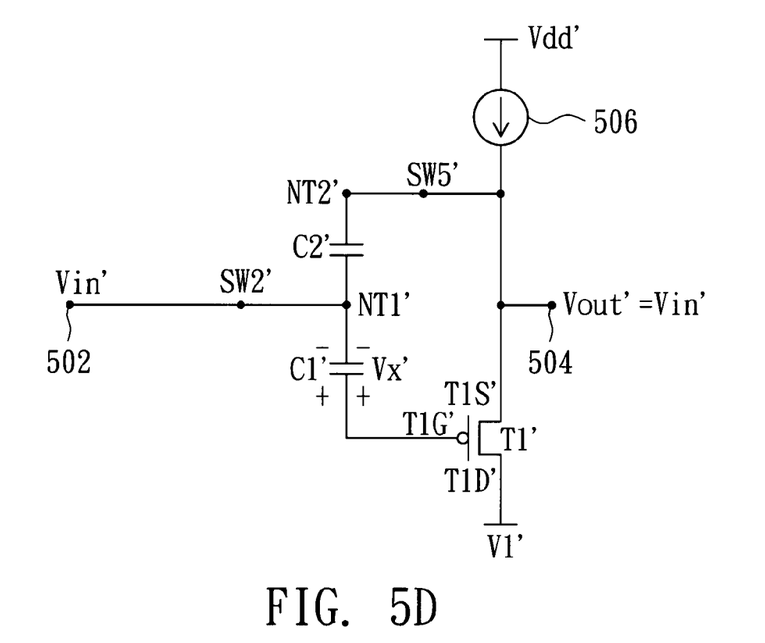
FIG. 5D is an equivalent circuit diagram of the analog buffer when the analog buffer of FIG. 5A is operated in a second operating period OT2'.
Figure 5E:
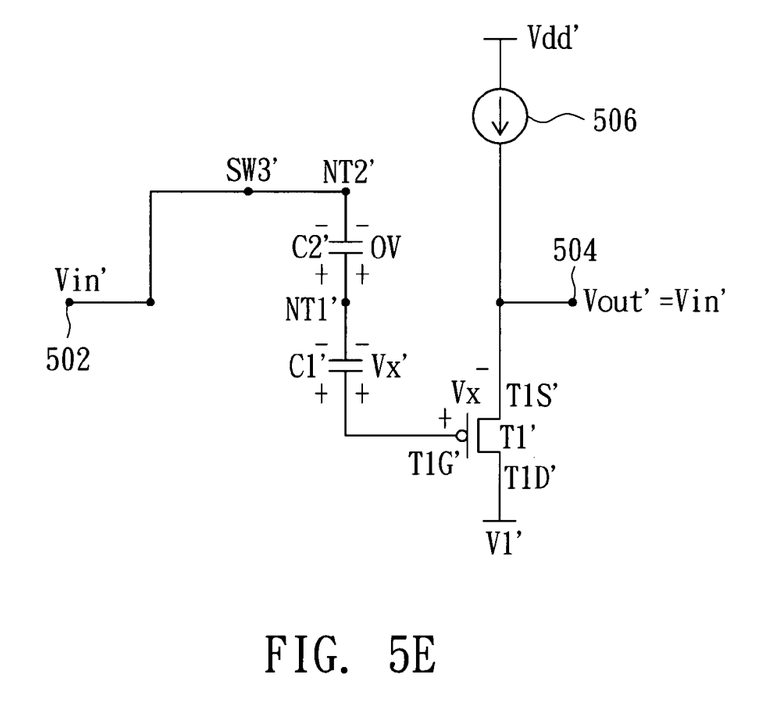
FIG. 5E is an equivalent circuit diagram of the analog buffer when the analog buffer of FIG. 5A is operated in a third operating period OT3'.

Referring to FIGS. 5C~5E, the equivalent circuit diagrams of the analog buffer 500 when the analog buffer 500 of FIG. 5A is respectively operated in operating periods OT1', OT2' and OT3' are shown. In the first operating period OT1', the cross-voltage of the capacitors C1' and C2' are respectively equal to voltage Vx' and zero. In the operating periods OT2' and OT3', the output voltage Vout' is fixed at voltage Vx' as the cross-voltage between the gate T1G' and the source T1S' is fixed, such that the voltage level of the output voltage Vout' is substantially equal to the voltage level of the input voltage Vin'.

According to the analog buffer of the present embodiment of the invention, the cross-voltage of the capacitors C1' and C2' is equal to a threshold voltage Vth' through the switch of enabling time among the switches SW1'~SW5'. Since the TFT T1' is a source follower, the analog buffer of the present embodiment of the invention further enables the voltage of the output voltage Vout' to follow the input voltage Vin' in operating periods OT2' and OT3'. The analog buffer 500 of the present embodiment of the invention also enables the voltage level of the output voltage Vout' to follow the voltage level of the input voltage Vin' accurately.

Fifth Embodiment

Figure 6:
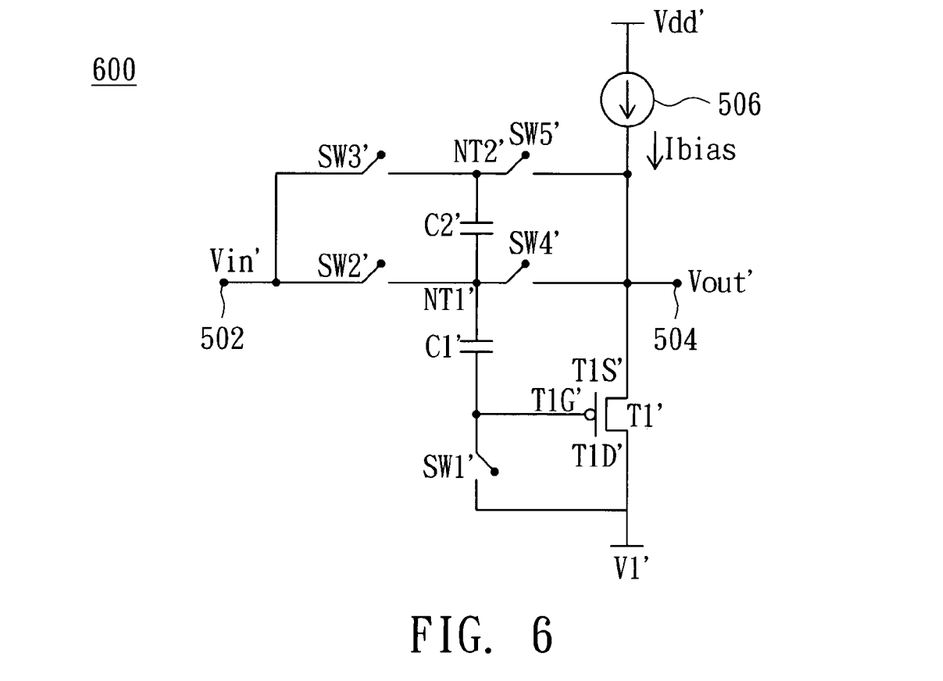
FIG. 6 is a circuit diagram of the analog buffer of the fifth embodiment of the present invention.

Referring to FIG. 6, a circuit diagram of the analog buffer of the fifth embodiment is shown. The analog buffer 600 of the fifth embodiment differs with the analog buffer 500 of the fourth embodiment in that one end of the switch SW1' also receives the voltage V1', such that the transistor T1' is also biased in a saturation region. The analog buffer 500 of the present embodiment of the invention also enables the voltage level of the output voltage Vout' to follow the voltage level of the input voltage Vin' accurately.

Sixth Embodiment

Figure 7:
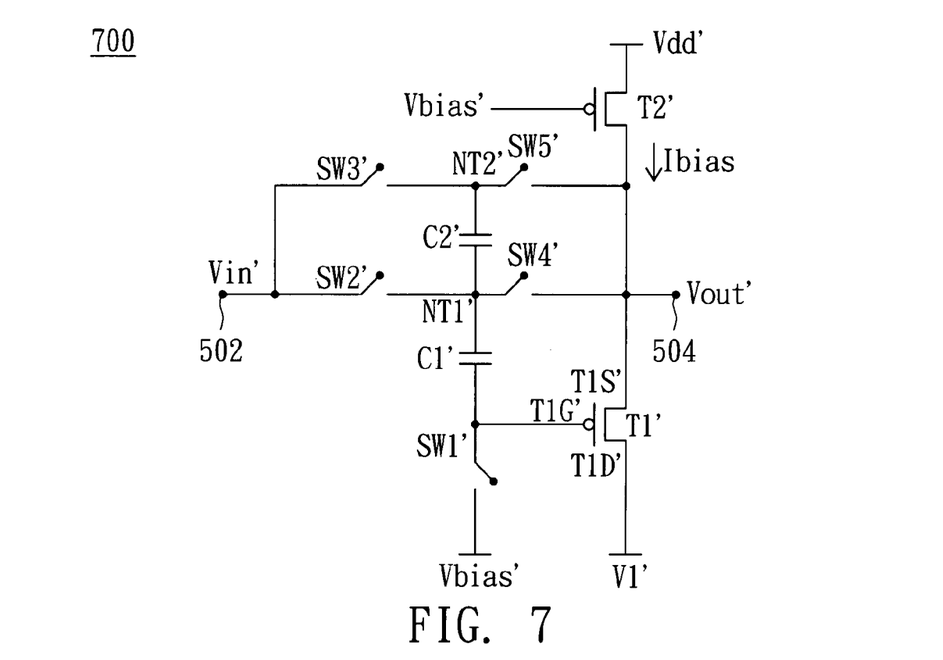
FIG. 7 is a circuit diagram of the analog buffer of the sixth embodiment of the present invention.

Referring to FIG. 7, a circuit diagram of the analog buffer of the sixth embodiment is shown. The analog buffer 700 of the sixth embodiment differs with the analog buffer 500 of the fourth embodiment in that the current source 306 is embodied by a transistor T2', and the voltage V2' is substantially equal to a voltage Vbias'. The voltage Vbias' is also inputted to the gate of the transistor T2', and the voltage Vbias' satisfies: Vbias'−Vdd'<=Vth', such that the transistor T2' will not enter termination region. The voltage Vbias' further satisfies: Vbias'−V1'>=Vth', such that the transistor T1' is also biased in a saturation region. The analog buffer 500 of the present embodiment of the invention also enables the voltage level of the output voltage Vout' to follow the voltage level of the input voltage Vin' accurately.

Despite the analog buffer is exemplified by a P-type TFT T1 in the above embodiments, the analog buffer 200 of the invention is not limited to a P-type TFT, and an N-type TFT can achieve substantially the same analog buffer effect as well.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An analog buffer for use in a source driver, wherein the analog buffer has an input end and an output end, and the input end is used to receive an input voltage, the analog buffer comprising:

a transistor having a source electrically coupled to the output end, and a drain for receiving a first voltage;

a current source for outputting a bias current to bias the transistor;

a first switch having a first end and a second end, wherein the first end of the first switch receives a second voltage, the second end of the first switch is electrically coupled to the gate of the transistor, and the second voltage is independent of the input voltage;

a first capacitor having a first end and a second end, wherein the first end of the first capacitor is electrically coupled to the gate of the transistor;

a second capacitor having a first end and a second end, wherein the first end of the second capacitor is electrically coupled to the gate of the transistor;

a second switch having a first end and a second end, wherein the first and the second ends of the second switch are electrically coupled to the input end and the second end of the first capacitor, respectively;

a third switch having a first end and a second end, wherein the first and the second ends of the third switch are electrically coupled to the input end and the second end of the second capacitor, respectively;

a fourth switch having a first end and a second end, wherein the first and the second ends of the fourth switch are electrically coupled to the second end of the first capacitor and the output end, respectively; and a fifth switch having a first end and a second end, wherein the first and the second ends of the fifth switch are electrically coupled to the second end of the second capacitor and the output end, respectively, wherein the first switch and the fourth switch are enabled and the second switch, the third switch and the fifth switch are disabled, in a first period;

the second switch and the fifth switch are enabled and the first switch, the third switch and the fourth switch are disabled, in a second period that comes after the first period, and the third switch is enabled and the first switch, the second switch, the fourth switch, and the fifth switch are disabled, in a third period that comes after the second period.

2. The analog buffer according to claim 1, wherein the analog buffer is a source follower.

3. The analog buffer according to claim 1, wherein when the analog buffer operates in the first period, the cross-voltage between the first and the second ends of the first capacitor is substantially equal to a threshold voltage of the transistor, the voltage of the output end is substantially equal to the difference between the threshold voltage and the second voltage, and the gate voltage of the transistor is substantially equal to the second voltage.

4. The analog buffer according to claim 1, wherein when the analog buffer operates in the second period, the gate voltage of the transistor is substantially equal to the sum of the input voltage and the threshold voltage, and the voltage of the output end is substantially equal to the input voltage.

5. The analog buffer according to claim 1, wherein when the analog buffer operates in the third period, the gate voltage of the transistor is substantially equal to the sum of the input voltage and the threshold voltage, and the voltage of the output end is substantially equal to the input voltage.

6. The analog buffer according to claim 1, wherein the transistor is a P-type metal oxide semiconductor (PMOS) transistor.

7. The analog buffer according to claim 6, wherein the second voltage is greater than or equal to the first voltage.

8. The analog buffer according to claim 1, wherein the transistor is an N-type metal oxide semiconductor (NMOS) transistor.

9. The analog buffer according to claim 8, wherein the second voltage is smaller than or equal to the first voltage.

10. An analog buffer for use in a source driver, wherein the analog buffer has an input end and an output end, and the input end is used to receive an input voltage, the analog buffer comprising:

a transistor having a source electrically coupled to the output end, and a drain for receiving a first voltage;

a current source used to output a bias current flowing through the transistor to bias the transistor;

a first switch having a first end and a second end, wherein the first end of the first switch receives a second voltage, the second end of the first switch is electrically coupled to the gate of the transistor, and the second voltage is independent of the input voltage;

a first capacitor having a first end and a second end, wherein the first end of the first capacitor is electrically coupled to the gate of the transistor;

a second capacitor having a first end and a second end, wherein the first end of the second capacitor is electrically coupled to the second end of the first capacitor;

a second switch having a first end and a second end, wherein the first and the second ends of the second switch are electrically coupled to the input end and the second end of the first capacitor respectively;

a third switch having a first end and a second end, wherein the first and the second ends of the third switch are electrically coupled to the input end and the second end of the second capacitor respectively;

a fourth switch having a first end and a second end, wherein the first and the second ends of the fourth switch are electrically coupled to the second end of the first capacitor and the output end respectively; and a fifth switch having a first end and a second end, wherein the first and the second ends of the fifth switch are electrically coupled to the second end of the second capacitor and the output end respectively, wherein when the analog buffer operates in a first period, the first switch, the fourth switch and the fifth switch are enabled, while the second switch and the third switch are disabled, when the analog buffer operates in a second period that comes after the first period, the second switch and the fifth switch are enabled, while the first switch, the third switch and the fourth switch are disabled, and when the analog buffer operates in a third period that comes after the second period, the third switch is enabled, while the first switch, the second switch, the fourth switch and the fifth switch are disabled.

11. The analog buffer according to claim 10, wherein the analog buffer comprises a source follower.

12. The analog buffer according to claim 10, wherein when the analog buffer operates in the first period, the cross-voltage between the first and the second ends of the first capacitor is substantially equal to a threshold voltage of the transistor, the voltage of the output end is substantially equal to the difference between the threshold voltage and the second voltage, and the gate voltage of the transistor is substantially equal to the second voltage.

13. The analog buffer according to claim 10, wherein when the analog buffer operates in the second period, the gate voltage of the transistor is substantially equal to the sum of the input voltage and the threshold voltage, and the voltage of the output end is substantially equal to the input voltage.

14. The analog buffer according to claim 10, wherein when the analog buffer operates in the third period, the gate voltage of the transistor is substantially equal to the sum of the input voltage and the threshold voltage, and the voltage of the output end is substantially equal to the input voltage.

15. The analog buffer according to claim 10, wherein the transistor comprises a PMOS transistor.

16. The analog buffer according to claim 15, wherein the second voltage is greater than or equal to the first voltage.

17. The analog buffer according to claim 10, wherein the transistor comprises an NMOS transistor.

18. The analog buffer according to claim 17, wherein the second voltage is smaller than or equal to the first voltage.

* * * * *